(12) United States Patent
Edwards et al.

(10) Patent No.: US 8,223,128 B1
(45) Date of Patent: Jul. 17, 2012

(54) OPTICAL INPUT SYSTEM AND METHOD

(75) Inventors: Andrew G. Edwards, Morganville, NJ (US); Charles J. Burns, Cinnaminson, NJ (US); George S. Hartigan, Jr., Jackson, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 737 days.

(21) Appl. No.: 12/247,668

(22) Filed: Oct. 8, 2008

(51) Int. Cl.
*G06F 3/02* (2006.01)
*G09G 3/00* (2006.01)
*G01D 11/28* (2006.01)

(52) U.S. Cl. .............................. 345/170; 345/32; 362/26

(58) Field of Classification Search ................. 345/32, 345/170; 362/26; 341/31
See application file for complete search history.

(56) References Cited

U.S. PATENT DOCUMENTS

| | | | | |
|---|---|---|---|---|
| 3,526,775 A | | 9/1970 | Friedrich et al. | |
| 3,934,242 A | * | 1/1976 | Mueller | 345/170 |
| 4,477,725 A | | 10/1984 | Asawa et al. | |
| 4,484,179 A | | 11/1984 | Kasday | |
| 4,542,375 A | | 9/1985 | Alles et al. | |
| 4,634,857 A | * | 1/1987 | Fey | 250/227.26 |
| 4,701,017 A | | 10/1987 | Kookootsedes et al. | |
| 4,931,794 A | * | 6/1990 | Haag et al. | 341/31 |
| 5,605,406 A | | 2/1997 | Bowen | |
| 5,785,439 A | * | 7/1998 | Bowen | 400/472 |
| 6,195,016 B1 | * | 2/2001 | Shankle et al. | 340/815.42 |
| 6,417,506 B1 | * | 7/2002 | Pinkel et al. | 250/216 |
| 6,525,677 B1 | * | 2/2003 | Printzis | 341/31 |
| 6,876,786 B2 | * | 4/2005 | Chliaguine et al. | 385/13 |
| 7,268,705 B2 | | 9/2007 | Kong | |
| 7,295,724 B2 | * | 11/2007 | Wang et al. | 385/13 |
| 7,310,090 B2 | | 12/2007 | Ho et al. | |
| 7,351,949 B2 | | 4/2008 | Oon et al. | |
| 7,352,951 B2 | * | 4/2008 | Gotfried | 385/147 |
| 7,573,463 B2 | * | 8/2009 | Liess | 345/170 |
| 7,655,901 B2 | | 2/2010 | Idzik et al. | |
| 7,965,435 B2 | * | 6/2011 | Schuetz et al. | 359/279 |
| 8,059,925 B1 | * | 11/2011 | Edwards et al. | 385/13 |
| 2003/0067758 A1 | * | 4/2003 | Shipman | 362/26 |
| 2003/0090470 A1 | * | 5/2003 | Wolter et al. | 345/170 |
| 2005/0156875 A1 | | 7/2005 | Kong | |
| 2006/0066576 A1 | | 3/2006 | Kong | |
| 2008/0284925 A1 | | 11/2008 | Han | |
| 2009/0102797 A1 | * | 4/2009 | Shows | 345/168 |
| 2010/0110008 A1 | * | 5/2010 | Slotta | 345/161 |

* cited by examiner

*Primary Examiner* — Bipin Shalwala
*Assistant Examiner* — Benyam Ketema
(74) *Attorney, Agent, or Firm* — Howard IP Law Group, P.C.

(57) ABSTRACT

An input system comprises an optical device configured to transmit and receive one or more optical signals along a segment of fiber optic cable; an optical input device connected to the segment of fiber optic cable, the optical input including an input key configured to reflect a portion of an optical signal as a consequence of being actuated; and a signal decoder connected to the optical device, the signal decoder configured to select a first input code from a plurality of input codes, the first input code corresponding to the portion of the optical signal reflected by the input key.

25 Claims, 5 Drawing Sheets

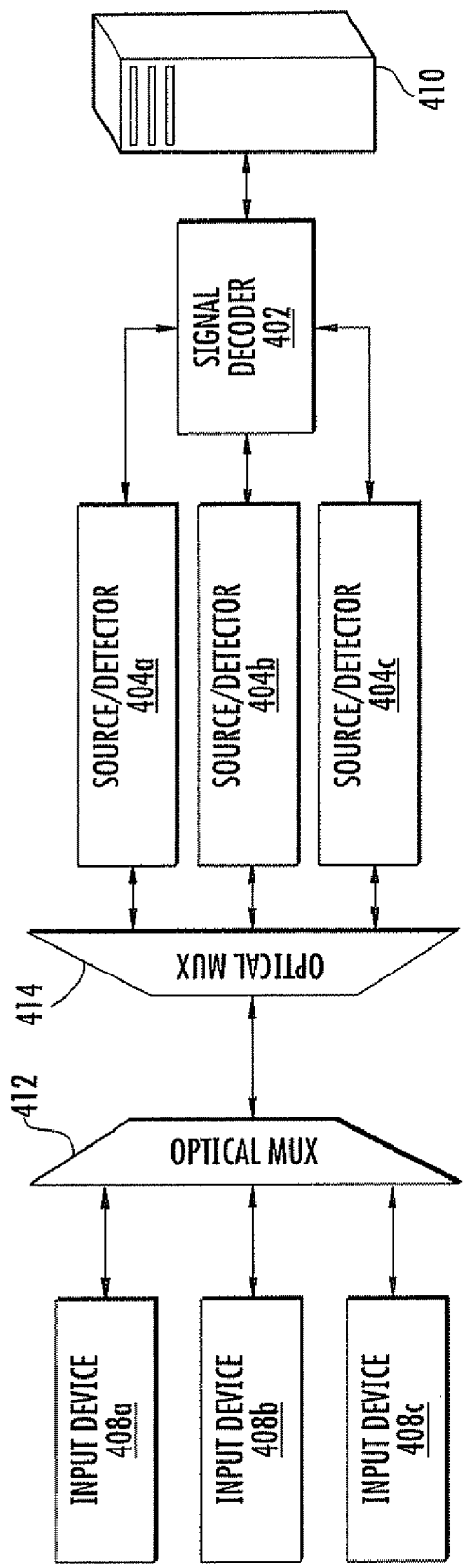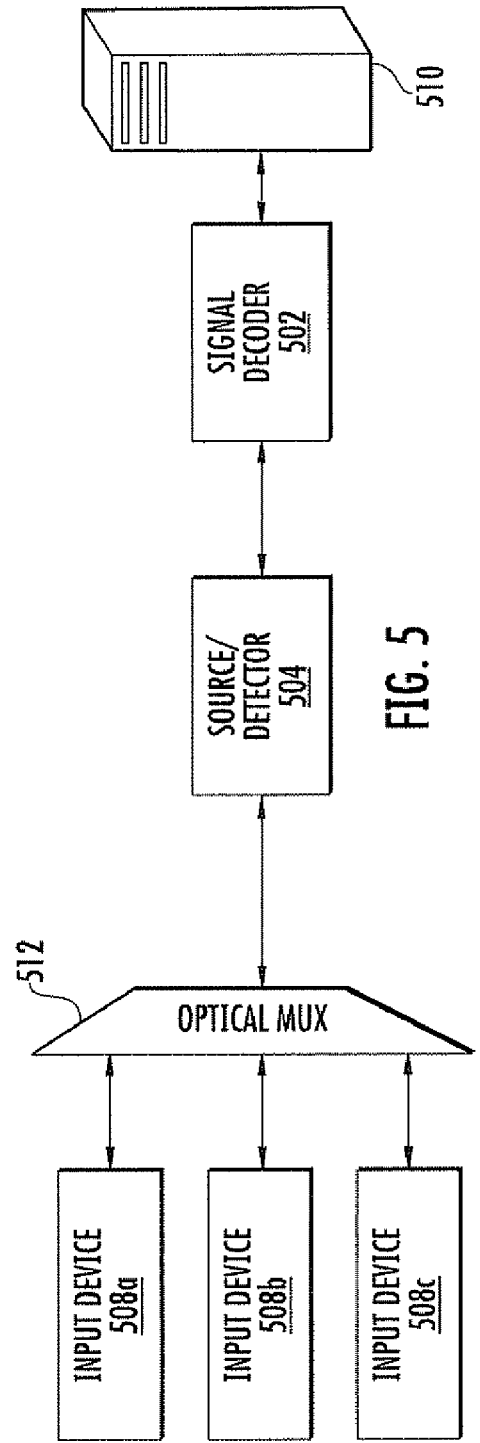

OPTICAL INPUT SYSTEM AND METHOD

FIELD OF INVENTION

The invention relates to data transfer. More specifically, the invention relates to a method and system for transferring data from one or more computer peripherals to one or more computers using fiber optic cable.

BACKGROUND

Computer peripherals or input devices, such as a mouse, keypad, or keyboard transfer data to a central processing unit (CPU) of a computer over short runs of electrical or conductive cabling measuring only a few meters in length. There are certain circumstances in which computer peripherals need to be located at more than a few meters from the CPU. Conventional solutions to extend the distances between the CPU and peripherals typically utilize longer lengths of conductive cabling or use wireless connectivity, such as a Personal Area Network (PAN), to extend the distances between the CPU and the peripherals.

For example, various keyboard/video/mouse (KVM) extender systems enable peripherals to be located up to a couple hundred meters from the CPU. However, increasing the distance between the CPU and peripherals beyond a couple hundred meters is not possible with conventional KVM systems due to data transmission limitations and signaling speed. Additionally, conventional KVM extender systems are susceptible to being tapped or spliced between the CPU and the attached peripherals without the knowledge of the primary user or the system.

Peripherals configured to utilize Bluetooth® technology in accordance with the IEEE 802.11 specification are also able to be located at distances greater than a few meters from the CPU, but the distance is only extendable up to about 100 meters. Additionally, Bluetooth® technology, like KVM and other conventional extender systems, is susceptible to being tapped or other unknown security breaches.

Thus, an improved system and method for transferring data from one or more computer peripherals to one or more remotely located computers, is needed.

SUMMARY

In one embodiment, an optical input system comprises: a first optical fiber segment defining a beam path and a source for injecting a first optical signal into the first optical fiber segment. The first input device includes a first input key and a first beam splitter disposed along the first optical fiber segment at a first location. The beam splitter divides the first optical signal into a first portion that continues along the beam path of the first optical fiber segment and a second portion that diverges from the first portion. The input device includes a first reflector connected to the first input key for reflecting the second portion of the first optical signal in response to actuation of the first input key. The optical system includes a detector for receiving the second portion of the first optical signal reflected by the first reflector and determining whether the first input key is actuated, and a signal decoder configured to select a first input code from a plurality of input codes. The first input code corresponding to the reflected signal.

In some embodiments an optical input method comprises transmitting an optical signal along a beam path of a fiber optic cable, diverting a first portion of the optical signal towards a reflector, reflecting the first portion of the optical signal if a first input key is actuated determining a characteristic of the reflected optical signal, and selecting a first input code from a plurality of input codes, the first input code corresponding to the reflected signal.

In some embodiments an input system comprises an optical device for transmitting and receiving one or more optical signals along a segment of fiber optic cable, an optical input device including an input key for reflecting a portion of an optical signal in response to being actuated; and a signal decoder for selecting a first input code from a plurality of input codes. The first input code corresponding to the portion of the optical signal reflected by the input key.

BRIEF DESCRIPTION OF THE DRAWINGS

Various aspects of the present disclosure will be or become apparent to one with skill in the art by reference to the following detailed description when considered in connection with the accompanying exemplary non-limiting embodiments, wherein:

FIG. 4 is a schematic illustration of an embodiment of multiplexed optical inputs; and FIG. 5 is a schematic illustration of another embodiment of multiplexed optical inputs.

DETAILED DESCRIPTION

Figure 1:
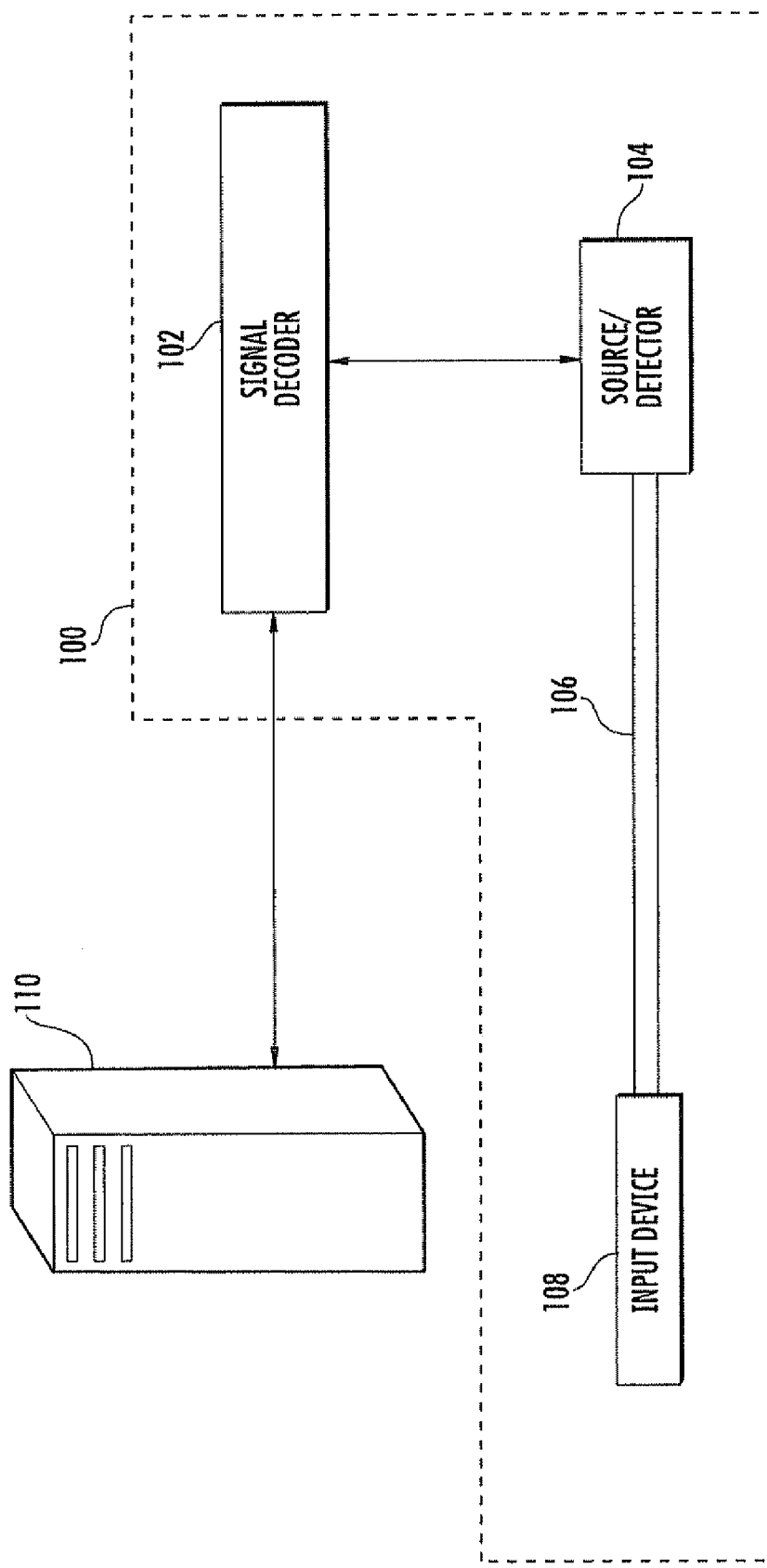
FIG. 1 is a schematic illustration of an exemplary embodiment of an optical input system.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling, and the like, such as "connected" and "interconnected," refer to a relationship wherein structures are secured or attached to one another either directly or indirectly through intervening structures, as well as both movable or rigid attachments or relationships, unless expressly described otherwise.

Data transfer methods and systems using fiber optic cable to overcome the signaling speed and transmission distance limitations of electrical cabling caused by signal impairments is now described. FIG. 1 is a schematic illustration of an exemplary embodiment of an optical input system 100 for transferring data to a computer 110. Computer 110 may be any type of computer having a central processing unit (CPU) such as a personal computer, server, or mainframe. Additionally, computer 110 may be configured to run any type of operating system including, but not limited to, Microsoft® Windows, Linux, Mac OS X, FreeBSD®, and the like. The computer 110 may be configured with one or more of a variety of peripheral ports such as, for example, a PS/2 port, an RS232 or serial port, a USB port, an IEEE 1284 or parallel port, a Peripheral Component Interconnect (PCI) slot, and an IEEE 1394 port to which optical input system 100 may be connected.

Optical input system 100 includes a signal decoder 102 connected to a source/detector device 104. The source/detector 104 is connected to input device 108 with an optical fiber segment 106. Using fiber optic cable 106 to transfer data from input device 108 to computer 110 advantageously enables the input device 108 to be located at distances on the order of kilometers from computer 110. In some embodiments, an optical repeater may be disposed between input device 108 and source/detector device 104 to further increase the distance between computer 110 and input device 108.

Figure 2:
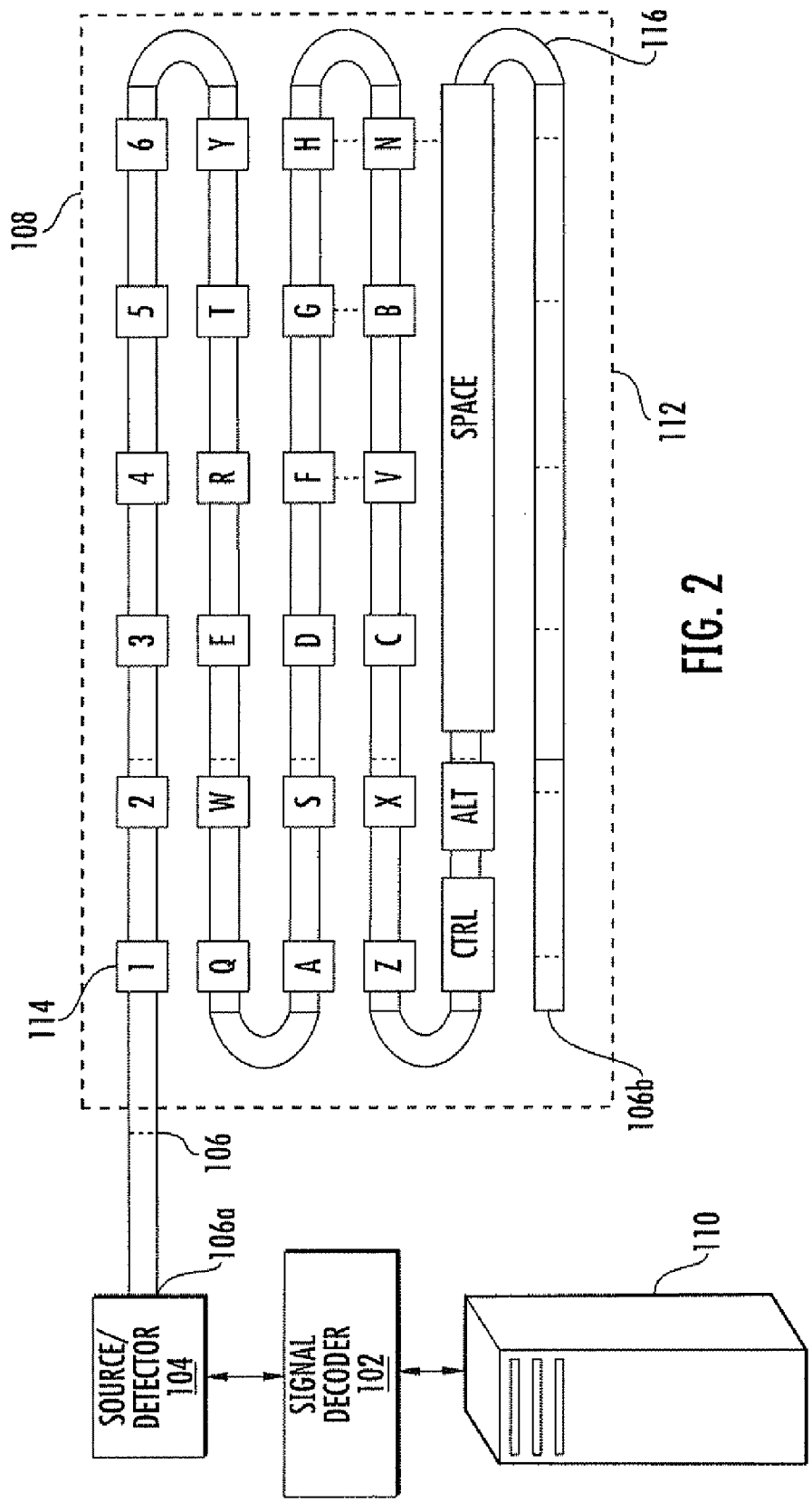
FIG. 2 is a schematic illustration of an exemplary optical input device.

As shown in FIG. 2, input device 108 includes a housing 112 having one or more input keys 114. The input device housing 112 may be fabricated or formed from any suitably rigid material including, but not limited to, a polymer or metal to protect the internal components of input device 108. Input device 108 may be a QWERTY-style keyboard having a plurality of keys 114 arranged in a plurality of rows and columns. Note that in some embodiments input device 108 may have more or fewer input keys 114 depending on the particular needs of a system. Additionally, the one or more input keys 114 may be arranged in a variety of configurations. Input keys 114 are arranged in rows and columns above fiber optic cable 106 within housing 112. Each input key 114 is normally biased in a first position and is configured to reversibly move to a second position when the upper surface of an input key 114 is pressed, for example, by a user's finger. When the force applied to the top surface of the input key 114 is removed, the input key 114 reversibly moves back to the first position.

Fiber optic cable 106 has a source end 106a and a terminal end 106b. Terminal end 106b is located at the end of a portion of fiber optic cable 106 and may be disposed within housing 112. As shown in FIG. 2, the portion of fiber optic cable 106 within housing 112 may have a serpentine form defining a plurality of rows separated by arcs 116. Note that while fiber optic cable 106 is shown in FIG. 2 arranged in rows, optical cable 106 may also be arranged in a series of columns each separated by an arc 116. In one embodiment, the one or more arcs 116 have a radius, R, which is greater than or equal to the minimum bend radius of the fiber optic cable 106.

Figure 3:
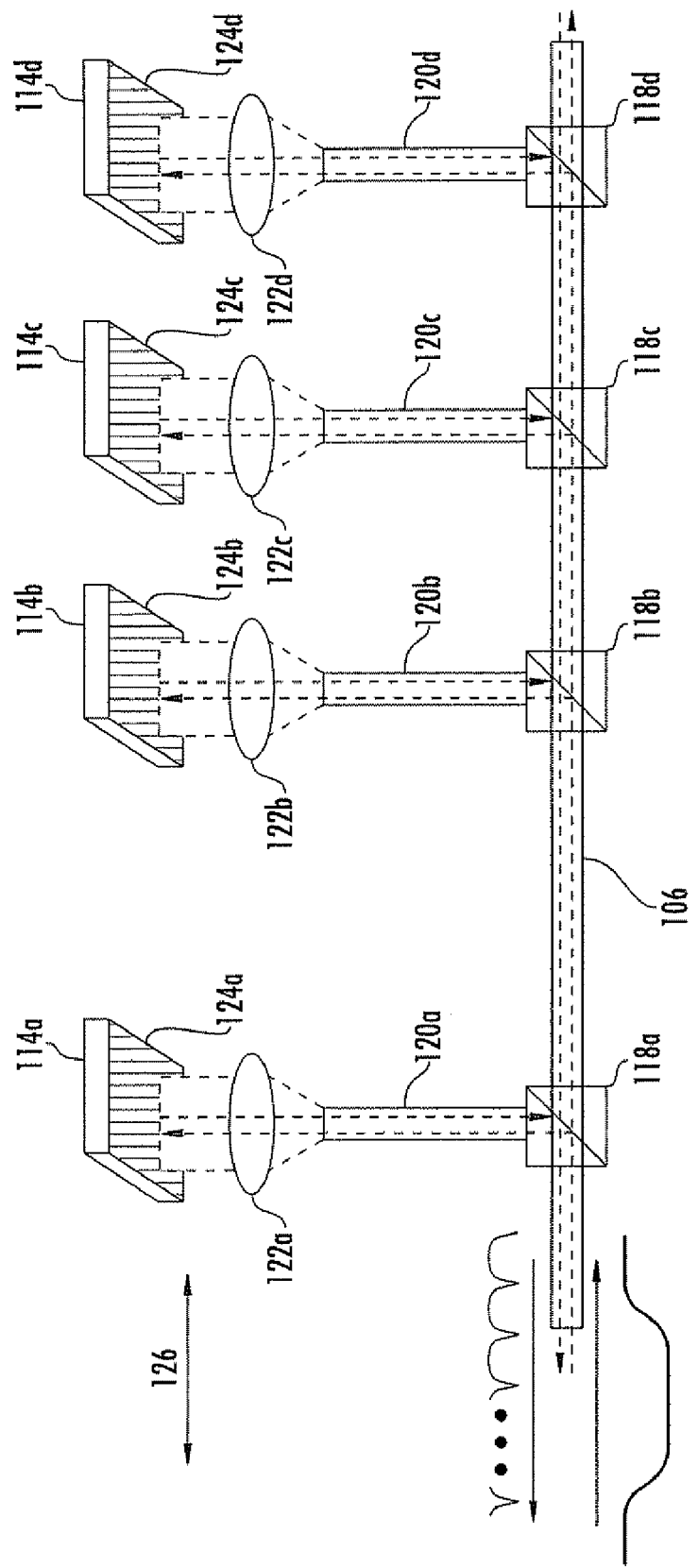
FIG. 3 is a schematic illustration of an exemplary layout of the internal components of the optical input device of FIG. 2.

In one embodiment shown in FIG. 3, one or more beam splitters 118a, 118b, 118c, 118d may be disposed at various distances along fiber optic cable 106. Each of the beam splitters 118a, 118b, 118c, 118d is associated with an input key 114a, 114b, 114c, 114d. In addition to being connected to fiber optic cable 106, each beam splitter 118a, 118b, 118c, 118d is connected to an optical conduit 120a, 120b, 120c, 120d. Each optical conduit 120a, 120b, 120c is connected to a beam splitter 118a, 118b, 118c at one end and the other end is connected to an optical lens 122a, 122b, 122c, 122d. Optical conduits 120a, 120b, 120c, 120d may each comprise a length of fiber optic cable. The fiber optic cable used for optical conduits 120a, 120b, 120c, 120d may be the same type of fiber optic cable used for fiber optic cable 106, although other materials that transmit optic signals may be used. Beam splitters 118a, 118b, 118c, 118d may be configured to reflect a particular wavelength of the signal emitted by source/detector 104 while passing the rest of the wavelengths in the signal along the beam axis of fiber optic cable 106. In other embodiments, each of the beam splitters 118a, 118b, 118c, 118d is configured to reflect a certain frequency of the incoming signal and pass the remaining frequencies along the beam path of optic cable 106.

The optical conduits 120a, 120b, 120c, 120d shown in FIG. 3 define beam paths that are perpendicular to the beam axis defined by fiber optic cable 106. Note that in other embodiments the beam axis defined by an optical conduit 120 may diverge from the beam path defined by fiber optic cable 106 at angles other than right angles. Each optical conduit 120a, 120b, 120c, 120d includes an optical lens 122a, 122b, 122c, 122d or other optical focusing means disposed at the end opposite the beam splitter 118a, 118b, 118c, 118d. Optical lenses 122a, 122b, 122c, 122d are configured to focus the optical signal traveling along optical conduits 120a, 120b, 120c, 120d onto a mask/reflector 124a, 124b, 124c, 124d and back into optical conduits 120a, 120b, 120c, 120d if the signal is reflected by mask/reflector 124a, 124b, 124c 124d.

Mask/reflectors 124a, 124b, 124c, 124d may be mechanically coupled to an input key 114a, 114b, 114c, 114d such that when an input key 114a, 114b, 114c, 114d is in its first position, mask/reflector 124a, 124b, 124c, 124d is positioned so that a signal emitted from an optical conduit 120a, 120b, 120c, 120d will not be reflected. When an input key 114a, 114b, 114c, 114d is actuated, e.g., pressed by a user's finger, the corresponding mask/reflector 124a, 124b, 124c, 124d is moved into a position such that it will reflect a signal back into an optical conduit 120a, 120b, 120c, 120d. In addition to reflecting the signal, a mask/reflector 124a, 124b, 124c, 124d may also encode the signal using a mask. For example, the mask may be similar to a barcode that creates a unique signature corresponding to a specific key of a specific input device in the reflected signal.

In this manner, the optical mask 124a, 124b, 124c, 124d is moved into and out of the path of the optical signal when a key 114a, 114b, 114c, 114d to which it is connected is pressed and then released. The signal is encoded and reflected by mask/reflector 124a, 124b, 124c, 124d. The reflected signal is focused by optical lens 122a, 122b, 122c, 122d into optical conduit 120a, 120b, 120c, 120d. The encoded signal travels along the beam axis defined by optical conduit 120a, 120b, 120c, 120d until it is redirected by beam splitter 118a, 118b, 118c, 118d back towards source/detector 104.

Source end 106a of fiber optic cable 106 is connected to source/detector device 104. Source end 106a may be connected to source/detector device using a commercially available fiber optic connector or a military grade fiber optic connector. In some embodiments, the source and detector may be separate devices. In other embodiments, the source/detector device 104 is an Optical Time Domain Reflector (OTDR) configured to inject a series of optical pulses along the beam axis of fiber optic cable 106. In other embodiments, source/detector 104 may be an Optical Spectrum Analyzer, a laser module, broadband light source module, and the like. Source/detector 104 is configured to receive optical signals reflected by input device 108 and to generate a reflection profile of the received signal. The reflection profile is used to determine the origin of the reflected signal, which is the result of an input key 114a, 114b, 114c, 114d being pressed or actuated. Signal decoder 102 uses the signal received from source/detector 104 to generate and transmit an input code to computer 110 that corresponds to an actuated key.

In some embodiments, the source/detector 104 and signal decoder 102 reside on a Peripheral Component Interconnect (PCI) card that is installed in a corresponding PCI slot in computer 110. Signal decoder 102 and source/detector 104 may be configured with a security protocol that signals computer 110 when an unexpected signal is received by source/detector 104. For example, if a person attempts to splice or tap into optical cable 106 between the input device 108 and source/detector device 104, the source/detector 104 will receive a reflected signal that does not correspond to the actuation of an input key 114a, 114b, 114c, 114d. Upon receipt of the unrecognized reflected signal, signal decoder 102 may transmit a signal corresponding to an alert to computer 110. Configuring the source/detector 104 and signal decoder 102 with a security protocol, in combination locating the source/detector 104 and signal decoder 102 within computer 102, enhances the security of the data transmission path between the computer and remotely located peripherals as a breach in the transmission path will be detected. In environments where security is less of a concern, the source/detector 104 and signal decoder 102 may be located externally of computer 110 and interface with computer 110 via a serial port, parallel port, IEEE 1394, PS/2, or USB connection.

With reference to FIGS. 2 and 3, the operation of input device 108 is now described. The source/detector 104 injects a signal into the fiber optic cable 106 and monitors the optical signals that are back-reflected from the optical path. The transmitted signal passes through each of the beam splitters 118a, 118b, 118c, 118d positioned along the fiber optic cable 106. When the signal arrives at the first beam splitter 118a, a portion of the signal is split off and passed along the optical conduit 120a. The remaining portion of the signal continues to travel along the axial beam path of the fiber optic cable 106 toward beam splitters 118b, 118c, 118d. At the second beam splitter 118b, another portion of the signal is split off and passed along an optical conduit 120b. In this manner, the signal emitted by source/detector 104 continues along the axial beam path of the fiber optic cable 106 until it reaches the terminal end 106b.

The portion of the signal that is split off by beam splitter 120a is passed along the beam path of the optical conduit 120a and emerges from the end of optical conduit 120a having an optical lens 122a. If the input key 114a is pressed, then the signal will be reflected and/or encoded by a mask/reflector 124a. As shown in FIG. 3, mask/reflectors 124a, 124b, 124c, 124d are located on the underside of the input keys 114a, 114b, 114c, 114d. Note that the mask/reflectors 124a, 124b, 124c, 124d may be mechanically connected to input keys 114a, 114b, 114c, 114d such that the mask/reflectors 124a, 124b, 124c, 124d slide in the direction indicated by arrow 126, pivot, or otherwise move into the focal region of optical lenses 122a, 122b, 122c, 122d when an input key 114a, 114b, 114c, 114d is actuated. The reflected and/or encoded signal passes back through optical lens 122a where it is focused into optical conduit 120a. This reflected and/or encoded signal continues along optical conduit 120a until it is redirected by a beam splitter 118a along the beam path of fiber optic cable 106 to source/detector 104. Alternatively, if input key 114a is not pressed, then the signal will not be reflected and/or encoded by a mask reflector 124a. Accordingly, since the signal is not reflected, then a signal is not retransmitted through optical conduit 120a or to source/detector 104.

When a reflected signal is received at source/detector 104, the source/detector 104 analyzes the signal to resolve which input key 114a, 114b, 114c, 114d of the input device 108 was actuated. The manner in which source/detector 104 resolves the actuated key or keys depends on the type of beam splitters 118a, 118b, 118c, 118d used in input device 108. For example, if the beam splitters 118a, 118b, 118c, 118d is configured to reflect particular wavelengths, the source/detector 104 will measure the wavelength(s) of the received signal and determine which key(s) 114a, 114b, 114c, 114d is actuated. In this configuration, each key 114a, 114b, 114c, 114d may be assigned a particular wavelength(s) that corresponds to the wavelength(s) that are redirected by the beam splitter 118a, 118b, 118c, 118d associated with it. For example, input key 114a may be assigned a range of wavelengths from 1300 nm to 1350 nm. Accordingly, the beam splitter 118a associated with input key 118a would be configured to diverge the range of wavelengths from 1300 nm to 1350 nm along optical conduit 120a and pass the remaining wavelengths in the signal along fiber optic cable 106.

In other embodiments, the beam splitters 118a, 118b, 118c, 118d divert particular frequencies of a signal along the optical conduits 120a, 120b, 120c, 120d while passing the remaining frequencies in the signal along fiber optic cable 106. In these embodiments, source/detector 104 will measure the frequency or frequencies of the received signal and determine which key(s) 114a, 114b, 114c, 114d is actuated. For example, each key 114a, 114b, 114c, 114d may be assigned a particular frequency, or range of frequencies, that corresponds to the frequency, or range of frequencies, that are diverted by the beam splitter 118a, 118b, 118c, 118d associated with each key 114a, 114b, 114c, 114d along optical conduits 120a, 120b, 120c, 120d. Accordingly, if an input key 114a, 114b, 114c, 114d is actuated, then the reflected signal received by source/detector 104 with include the frequency, or range of frequencies, associated with the actuated input key.

Once the source/detector 104 has resolved which key(s) 114a, 114b, 114c, 114d is actuated, a signal is sent to the signal decoder 102. Signal decoder 102 may be configured with a variety of input codes including, but not limited to, ASCII code, UNICODE code, and UCS code point. Using the information it receives from source/detector 104, signal decoder 102 selects an appropriate code and transmits a corresponding signal to computer 110, which is used by computer 110 to input data.

In some embodiments, such as the one illustrated in FIG. 4, multiple input devices 408a, 408b, 408c may be connected to a single computer 410. Each of the input devices 408a, 408b, 408c is connected to an optical multiplexer (mux) 412. In one embodiment, the optical multiplexer 412 is a Wavelength Division Multiplexer (WDM) configured to separate a group of wavelengths into one or more sets of predetermined wavelength groupings as described below. Note that although the embodiment is being described as dividing signals by wavelengths, in other embodiments the signal may be divided by frequency, phase, or other signal characteristics. Each of the predetermined wavelength groupings corresponds to an input device 408a, 408b, 408c connected to the optical mux 412. Optical mux 412 is also connected to a second optical mux 414 which may also be a WDM. As shown in FIG. 4, optical mux 414 may be connected to a plurality of source/detectors 404a, 404b, 404c, which are connected to the computer 410 through a signal decoder 402.

In operation, each of the source/detectors 404a, 404b, 404c generates a signal having a particular range of wavelengths. For example, source/detector 404a may generate an optical signal comprised of wavelengths ranging from 1300 nm to 1400 nm, source/detector 404b may generate an optical signal comprised of wavelengths ranging from 1450 nm to 1550 nm, and source/detector 404c may generate an optical signal comprised of wavelengths ranging from 1600 nm to 1700 nm. Each of these signals is combined by optical mux 414 into an optical signal having wavelengths ranging from 1300 nm to 1700 nm. One skilled in the art will appreciate that ranges of wavelengths other than wavelengths between 1300 nm and 1700 nm may be used. Optical mux 414 then transmits the combined optical signal to optical mux 412. Optical mux 412 demultiplexes the received signal and transmits a signal corresponding to the source/detector 404a, 404b, 404c to the input device 408a, 408b, 408c associated with the source/detector 404a, 404b, 404c. For example, if input device 408a is associated with source/detector 404a, then it would receive an optical signal comprised of wavelengths ranging from 1300 nm to 1400 nm. Similarly, if input device 408b is associated with source/detector 404b, then it would receive an optical signal comprised of wavelengths ranging from 1450 nm to 1550 nm, and input device 408c would receive an optical signal comprised of wavelengths ranging from 1600 nm to 1700 nm.

Once each input device 408a, 408c, 408c receives a signal, the operation of each input device 408a, 408b, 408c is similar to that described above with regard to the operation of the single input device 108. For example, an optical signal passes through each of the one or more beam splitters 118a, 118b, 118c, 118d of an input device 408a, 408b, 408c. When the signal arrives at the first beam splitter 118a, a portion of the signal is split off and passed along an optical conduit 120a, and the remaining portion of the signal continues to travel along the beam path of the fiber optic cable. If another beam splitter 118b is connected to the optic cable, then another portion of the signal is split off and passed along an optical conduit 120b. In this manner, the signal continues along the beam path until it reaches the terminal end of the fiber optic cable.

The portion of the signal that is split off and passed along the beam path of the optical conduit 120a emerges from optical conduit 120a and is focused by optical lens 122a. If input key 114a is pressed, then this focused signal will be reflected and/or encoded by a mask/reflector 124a. The reflected and/or encoded signal is passes back through optical lens 122a where it is focused into optical conduit 120a. This reflected and/or encoded signal continues along optical conduit 120a until it is redirected by a beam splitter 118a along the beam path of the fiber optic cable back towards optical mux 412. Alternatively, if an input key 114a, 114b, 114c, 114d is not pressed, then the signal will not be reflected and/or encoded by a mask reflector 124a, 124b, 124c, 124d. Accordingly, since the signal is not reflected, then a signal is not retransmitted through optical conduit 120a, 120b, 120c, 120d or back to optical mux 412. Optical mux 412 will combine the received signals from each input device 408a, 408b, 408c and transmit the signal to optical mux 414. Optical mux 414 will demultiplex the received signal and transmit a signal back to each source/detector 404a, 404b, 404c.

The signal received at a source/detector 404a, 404b, 404c, is analyzed the received signal to determine wavelength(s) of the received signal and thus which input key 114a, 114b, 114c, 114d on the input device 408a, 408b, 408c is actuated. Once the source/detectors 404a, 404b, 404c resolve which key(s) 114a, 114b, 114c, 114d is actuated, each source/detector 404a, 404b, 404c sends a signal to the signal decoder 402. Signal decoder 402 may be configured with a variety of input codes including, but not limited to, ASCII code, UNICODE code, and UCS code point. Using the information it receives from source/detectors 404a, 404b, 404c signal decoder 402 selects an appropriate code and transmits a corresponding signal to computer 410.

FIG. 5 illustrates another embodiment where multiple input devices 508a, 508b, 508c are connected to a single computer 510. As shown in FIG. 5, input devices 508a, 508b, 508c are connected to a source/detector 504 through an optical mux 512. Source/detector 504 is connected to signal decoder 502, which is connected to computer 510. In one embodiment, optical mux 512 is a WDM configured to multiplex one or more optical signals received from input devices 508a, 508b, 508c into a signal optical signal that can be transmitted over an optical link to source/detector 504. Optical mux 512 is further configured to demultiplex an optical signal received from source/detector 504 into a number of optical signals equal to the number of input devices 508a, 508b, 508c connected to the optical mux 512.

In operation, the source/detector 504 generates a signal and transmits it to optical mux 512 by way of a fiber optic cable. Optical mux 512 demultiplexes the signal it receives from source/detector 504 and transmits a signal corresponding to each of the input devices 508a, 508b, 508c. The optical mux 512 may demultiplex the signal into three signals having distinct characteristics. For example, optical mux 512 may demultiplex the signals so that each signal it sends to an input device 508a, 508b, 508c has a particular range of wavelengths, frequencies, phase, or other signal characteristic.

For each input device 508a, 508b, 508c, the optical signal it receives from optical mux 512 passes through each of the one or more beam splitters 118a, 118b, 118c, 118d (as shown in FIG. 3) positioned along the fiber optic cable 106. When the signal arrives at the first beam splitter 118a, a portion of the signal is split off and passed along an optical conduit 120a. The remaining portion of the signal continues to travel along the axial beam path of the fiber optic cable to which the beam splitter is connected. A second beam splitter 118b connected to the fiber optic cable diverts another portion of the optical signal and passes it along optical conduit 120b. In this manner, the signal continues along the axial beam path until it reaches the terminal end of the fiber optic cable.

The portion of the signal that is split off by beam splitter 118a travels along the beam path of the optical conduit 120a and is focused by optical lens 122a. If the input key 114a associated with the beam splitter 118a is actuated, then the signal will be reflected and/or encoded by a mask/reflector 124a. The reflected and/or encoded signal is passes back through optical lens 122a where it is focused into optical conduit 120a. This reflected and/or encoded signal continues along optical conduit 120a until it is redirected by a beam splitter 118a along the beam path of fiber optic cable to optical mux 512. If an input key 114a, 114b, 114c, 114d is not pressed, then a signal will not be reflected and/or encoded by a mask reflector 124a, 124b, 124c, 124d. Accordingly, since a signal is not reflected, then a signal is not retransmitted through an optical conduit 120a, 120b, 120c, 120d or back to optical mux 512. Optical mux 512 will combine the reflected signals received from each input device 508a, 508b, 508c and transmit the signal to the source/detector 504.

When a reflected signal is received at source/detector 504, the source/detector 504 analyzes the received signal to determine wavelength(s) of the received signal and thus determine which key(s) 114a, 114b, 114c, 114d of which input device(s) 508a, 508b, 508c was actuated. Once the source/detector 504 has resolved which key(s) have been actuated, it sends a signal to the signal decoder 502. Signal decoder 502 may be configured with a variety of input codes including, but not limited to, ASCII code, UNICODE code, and UCS code point. Using the information it receives from source/detector 504, signal decoder 502 selects an appropriate code and transmits a corresponding signal to computer 510.

Figure 6:
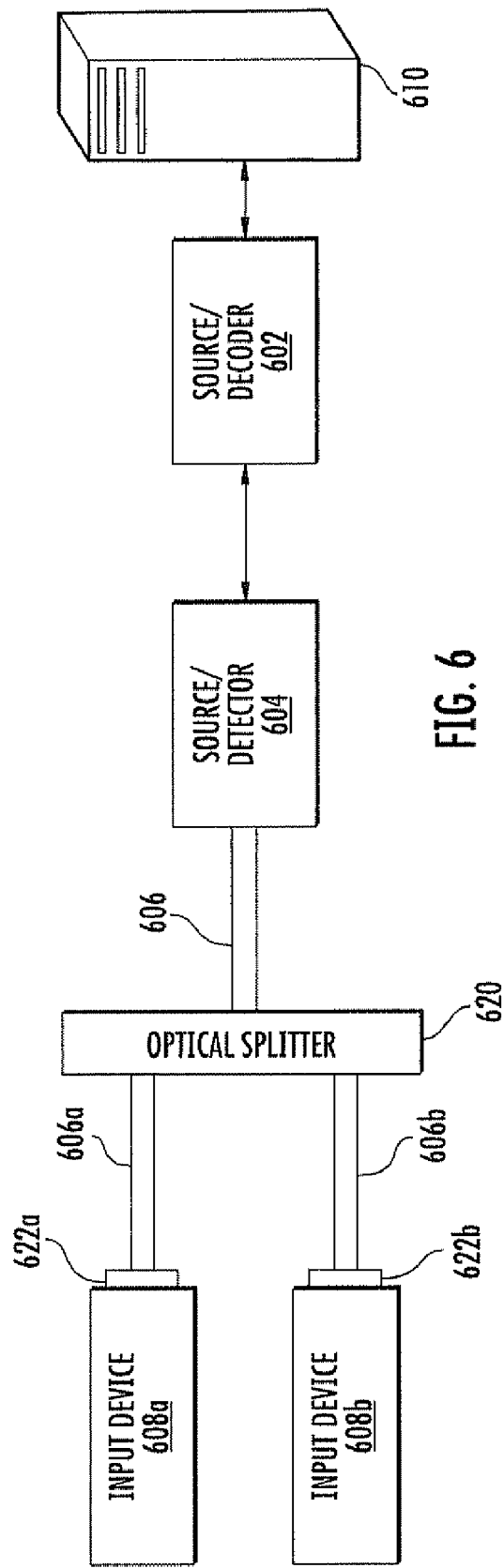
FIG. 6 is a schematic illustration of an optical input system in which multiple input devices are connected to a single computer.

FIG. 6 illustrates another embodiment in which multiple input devices 608a, 608b may be connected to a single computer 610. Note that although FIG. 6 is illustrated with two input devices connected to computer 610, more input devices may be connected to computer 610. As shown in FIG. 6, fiber optic cable 606 is connected at one end to source/detector device 604 and to an optical splitter 620 at the other end. Optical splitter 620 is connected to input device 608a via fiber optic cable segment 606a and to input device 608b via fiber optic cable segment 606b. Input devices 608a and 608b are connected to their respective fiber optic cable segments 606a and 606b by optical coupling devices 622a and 622b. In this configuration, input devices 608a and 608b may be releasably coupled to their respective fiber optic segments 606a and 606b. Optical coupling devices 622a and 622b may include a filter configured to pass a portion of the full frequency or wavelength spectrum transmitted by source/detector device 604 so that signal decoder 602 can easily determine from which input device 608a, 608b a reflected signal originated.

For example, in operation the source/detector device 604 will transmits an optical signal having a range of wavelengths, e.g., 1300 nm to 1700 nm, which is transmitted to input devices 608a and 608b by way of optical splitter 620. If optical coupling device 622a connected to input includes a filter configured to pass wavelengths between 1300 nm and 1450 nm, then only wavelengths within that range will be transmitted to input device 608a. Similarly, optical coupling device 622b may include a filter configured to pass wavelengths between 1550 nm and 1700 nm and thus only wavelengths within this range will be transmitted to optical input device 608b. Accordingly, if a reflected signal having is received by source/detector circuit 604 has a wavelength between 1300 nm and 1450, then it originated at input device 608a, and if a reflected signal is received by source/detector circuit 604 has a wavelength between 1550 nm and 1700 nm, then it originated at input device 608b. Signal decoder 602 may be further configured to resolve which key of which input device has been actuated as described above.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An optical input system, comprising:
   a first optical fiber segment defining a beam path;
   a source for injecting a first optical signal into the first optical fiber segment;
   a first input device including:
     a first input key;
     a first beam splitter disposed along the first optical fiber segment at a first location, the beam splitter for dividing the first optical signal into a first portion that continues along the beam path of the first optical fiber segment and a second portion that diverges from the first portion; and
     a first reflector connected to the first input key for reflecting the second portion of the first optical signal in response to actuation of the first input key; and
   a detector for receiving the second portion of the first optical signal reflected by the first reflector and determining whether the first input key is actuated; and
   a signal decoder configured to select a first input code from a plurality of input codes, the first input code corresponding to the reflected signal.

2. The system of claim 1, wherein the input key is configured to reversibly move from a first position to a second position.

3. The system of claim 2, wherein the input key is actuated in the second position.

4. The system of claim 1, wherein the beam splitter is configured to divide the first optical signal based on a predetermined wavelength or predetermined range of wavelengths.

5. The system of claim 1, wherein the beam splitter is configured to divide the first optical signal based on a predetermined wavelength or predetermined range of frequencies.

6. The system of claim 1, wherein the first input device further comprises:

a second input key;
   a second beam splitter disposed along the optical fiber segment at a second location, the second beam splitter for dividing the first portion of the first optical signal into a third portion and a fourth portion, wherein the third portion of the first optical signal continues along the beam path of the optical fiber segment and the fourth portion of the optical signal diverges from the first portion; and
   a second reflector for reflecting the fourth portion of the first optical signal in response to the actuation of the second input key.

7. The system of claim 6, wherein the detector is also for receiving the fourth portion of the first optical signal reflected by the second reflector and determining whether the first or second input key is actuated.

8. The system of claim 7, wherein the signal decoder is further configured to select a second input code from a plurality of input codes, the second input code corresponding to the fourth portion of the first optical signal reflected by the second reflector.

9. The system of claim 8, wherein the plurality of input codes includes at least one of an ASCII code, a UNICODE code point, or a UCS code point.

10. The system of claim 8 further comprising an optical repeater disposed between the source and the optical input device.

11. The system of claim 1, further comprising:
    a second input device, the second input device including:
      a first input key;
      a first beam splitter disposed along a second optical fiber segment at a first location of the second optical fiber segment, the first beam splitter of the second input device for dividing a second optical signal into a first portion that continues along a beam path of the second optical fiber segment and a second portion that diverges from the first portion of the second optical signal; and
      a first reflector for reflecting the second portion of the second optical signal in response to actuation of the first input key of the second input device; and
    an optical multiplexer connected to the first and second optical fiber segments, the optical multiplexer for combining the second portions of the first and second optical signals into a combined signal and transmitting the combined signal to the detector.

12. The system of claim 11, wherein the optical multiplexer is a wave division multiplexer.

13. An optical input method, comprising the steps of:
    transmitting an optical signal along a beam path of a fiber optic cable;
    diverting a first portion of the optical signal towards a reflector;
    reflecting the first portion of the optical signal if a first input key is actuated;
    determining a characteristic of the reflected optical signal; and
    selecting a first input code from a plurality of input codes, the first input code corresponding to the reflected signal.

14. The optical input method of claim 13, further comprising:
    transmitting the first input code over a standard computer peripheral interface.

15. The optical input method of claim 13, wherein the characteristic of the signal is a predetermined wavelength or predetermined range of wavelengths of the reflected signal.

16. The optical input method of claim 13, wherein the characteristic of the signal is a predetermined frequency or predetermined range of frequencies of the reflected signal.

17. The optical input method of claim 13, further comprising:
- diverting at least a second portion of the optical signal towards a second reflector;
- reflecting the second portion of the optical signal as a second reflected signal if a second input key is actuated;
- determining a characteristic the second reflected signal; and
- selecting a second input code from the plurality of input codes, the second input code corresponding to the second reflected signal.

18. An input system comprising:
- an optical device for transmitting and receiving one or more optical signals along a segment of fiber optic cable;
- an optical input device including an input key for reflecting a portion of an optical signal in response to being actuated; and
- a signal decoder for selecting a first input code from a plurality of input codes, the first input code corresponding to the portion of the optical signal reflected by the input key.

19. The input system of claim 18, wherein the optical input device further includes:
- a beam splitter for dividing an optical signal into a first portion and a second portion; and
- a reflector for reflecting the second portion of the divided optical signal in response to actuation of the input key.

20. The input system of claim 19, wherein the beam splitter divides the optical signal based on a predetermined wavelength or a predetermined range of wavelengths.

21. The input system of claim 19, wherein the beam splitter is configured to divide the optical signal based on a predetermined frequency or a predetermined range of frequencies.

22. The input system of claim 18, further comprising:
- a second optical input device including a second input key for reflecting a portion of an optical signal in response to being actuation; and
- a first optical multiplexer for combining the reflected signal portions received from the first and second input devices and for transmitting the combined signal to the optical device.

23. The input system of claim 22, further comprising:
- a second optical device for transmitting and receiving one or more optical signals along a third segment of fiber optic cable; and
- a second optical multiplexer connected for combining signals received from the first and second optical devices and for transmitting the combined signal to the first optical multiplexer.

24. The input system of claim 23, wherein the first optical multiplexer demultiplexes the combine signal received from the second optical multiplexer.

25. The input system of claim 18 further comprising an optical repeater disposed between the optical device and the optical input device.

* * * * *